(12) United States Patent
Kawai

(10) Patent No.: US 11,683,891 B2
(45) Date of Patent: Jun. 20, 2023

(54) INSPECTION METHOD OF PRINTED WIRING BOARD

(71) Applicant: IBIDEN CO., LTD., Gifu (JP)

(72) Inventor: Yasuhiro Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/450,591

(22) Filed: Oct. 12, 2021

(65) Prior Publication Data

US 2022/0124912 A1    Apr. 21, 2022

(30) Foreign Application Priority Data

Oct. 16, 2020    (JP) .................... 2020-174500

(51) Int. Cl.
*H05K 3/40*    (2006.01)
*H05K 1/02*    (2006.01)

(52) U.S. Cl.
CPC ......... *H05K 3/4038* (2013.01); *H05K 1/0269* (2013.01); *H05K 2203/166* (2013.01)

(58) Field of Classification Search
CPC ........... H05K 3/4038; H05K 2203/166; H05K 1/0269; H05K 2201/0989; H05K 2201/09918; Y10T 29/491155; Y10T 29/49165; H01L 22/20; H01L 22/32
USPC .................................................. 29/846, 852
See application file for complete search history.

(56) References Cited

U.S. PATENT DOCUMENTS

| | | | | |
|---|---|---|---|---|
| 4,510,446 A | * | 4/1985 | Braun | G01R 31/2805 |
| | | | | 324/763.01 |
| 7,333,346 B2 | * | 2/2008 | Miyagawa | H01L 22/32 |
| | | | | 361/784 |
| 9,490,181 B2 | * | 11/2016 | Chung | H01L 22/20 |

FOREIGN PATENT DOCUMENTS

JP    2008-181998 A    8/2008

* cited by examiner

*Primary Examiner* — Donghai D Nguyen
(74) *Attorney, Agent, or Firm* — Oblon, McClelland, Maier & Neustadt, L.L.P.

(57) ABSTRACT

A method of inspecting a printed wiring board includes preparing a printed wiring board having product and inspection regions such that the board has inner-layer lands in the regions, forming vias on the inner-layer lands in the regions, forming outer peripheral part(s) in the wiring board such that the outer peripheral part(s) expose outer peripheral portion(s) of the inner-layer land in the inspection region, determining a center coordinate of the inner-layer land in the inspection region based on a position of the outer peripheral part(s), determining a center coordinate of the via(s) in the inspection region based on a shape of the via(s) in the inspection region, determining a misalignment amount based on a distance between the center coordinate of the inner-layer land and the center coordinate of the via(s) in the inspection region, and determining alignment accuracy between the via and the inner-layer land based on the misalignment amount.

20 Claims, 2 Drawing Sheets

INSPECTION METHOD OF PRINTED WIRING BOARD

CROSS-REFERENCE TO RELATED APPLICATIONS

The present application is based upon and claims the benefit of priority to Japanese Patent Application No. 2020-174500, filed Oct. 16, 2020, the entire contents of which are incorporated herein by reference.

BACKGROUND OF THE INVENTION

Field of the Invention

The present invention relates to an inspection method of a printed wiring board for inspecting alignment accuracy of a via and an inner-layer land of the printed wiring board.

Description of Background Art

To guarantee quality of a printed wiring board, alignment accuracy between a via and an inner-layer land that have been manufactured in the printed wiring board is accurately inspected. As an inspection method for determining alignment accuracy between a via and an inner-layer land that have been manufactured, a misalignment amount of a via of a test coupon may be checked using X-rays (see, for example, Japanese Patent Application Laid-Open Publication No. 2008-181998). The entire contents of this publication are incorporated herein by reference.

SUMMARY OF THE INVENTION

According to one aspect of the present invention, a method of inspecting a printed wiring board includes preparing a printed wiring board having a product region and a test coupon region such that the printed wiring board has an inner-layer land in the product region and an inner-layer land in the test coupon region, forming one or more vias on the inner-layer land in the product region and one or more vias on the inner-layer land in the test coupon region, forming one or more outer peripheral parts in the printed wiring board such that the one or more outer peripheral parts expose one or more outer peripheral portions of the inner-layer land in the test coupon region, determining a center coordinate of the inner-layer land in the test coupon region based on a position of the one or more outer peripheral parts, determining a center coordinate of the one or more vias formed on the inner-layer land in the test coupon region based on a shape of the one or more vias formed on the inner-layer land in the test coupon region, determining a misalignment amount based on a distance between the center coordinate of the inner-layer land in the test coupon region and the center coordinate of the one or more vias formed on the inner-layer land in the test coupon region, and determining alignment accuracy between the via and the inner-layer land based on the misalignment amount.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
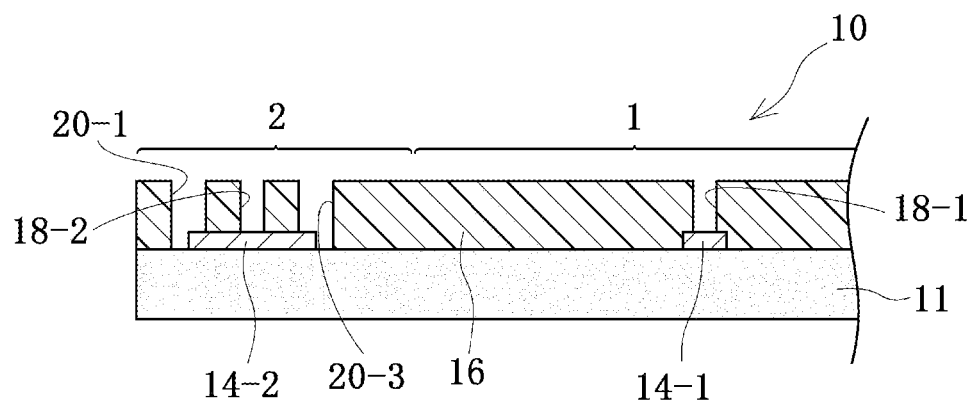
FIG. 1 is a cross-sectional view for describing a printed wiring board as an inspection object according to an embodiment of the present invention.

Embodiments will now be described with reference to the accompanying drawings, wherein like reference numerals designate corresponding or identical elements throughout the various drawings.

A printed wiring board that is an object of an inspection method according to an embodiment of the present invention is described with reference to the drawings. FIG. 1 illustrates an enlarged view of a portion of a printed wiring board 10 having a product region and a test coupon region of the embodiment. The printed wiring board 10 may be a substrate with a core having a lower layer formed by alternately laminating conductor layers and insulating layers on one side or both sides of a core substrate (not illustrated in the drawings), the conductor layers each having a predetermined circuit pattern. When the conductor layers are formed on both sides of the core substrate, conductor layers opposing each other via the core substrate may be connected to each other via through-hole conductors (not illustrated in the drawings). Or, the printed wiring board 10 may be a coreless substrate obtained by alternately laminating conductor layers and insulating layers on a support plate (not illustrated in the drawings) instead of a core substrate and then removing the support plate.

In the embodiment illustrated in FIG. 1, the printed wiring board 10 has a product region 1 where a circuit is formed in a central portion of the printed wiring board 10 and a test coupon region 2 where misalignment or the like during manufacturing is inspected at an edge part of the printed wiring board 10.

As illustrated in FIG. 1, the printed wiring board 10 having the product region 1 and the test coupon region 2 includes: a lower layer 11 in which multiple conductor layers and multiple insulating layers are alternately provided; an inner-layer land (14-1) formed of a conductor layer and an inner-layer land (14-2) formed of a conductor layer that are respectively simultaneously formed in the product region 1 and the test coupon region 2 on the lower layer 11; an insulating layer 16 that is formed on the inner-layer land (14-1) and the inner-layer land (14-2); and a via (18-1) and a via (18-2) that are respectively simultaneously formed in the product region 1 and the test coupon region 2 of the insulating layer 16. In FIG. 1, as will be described later, "20-1" and "20-3" are outer peripheral parts that are exposed by processing the inner-layer land (14-1) of the test coupon region 2 at the same time as processing the vias (18-1, 18-2). The lower layer 11 may be a double-sided plate without lamination.

A feature of a method of inspecting a printed wiring board according to an embodiment of the present invention is that, in the example illustrated in FIG. 1, a misalignment amount between the inner-layer land (14-2) and the via (18-2) of the test coupon region 2 is determined based on a center coordinate of the inner-layer land (14-2) and a center coordinate of the via (18-2) with respect to the inner-layer land (14-2), and alignment accuracy between the inner-layer land (14-2) and the via (18-2) is inspected based on the misalignment amount.

Figure 2:
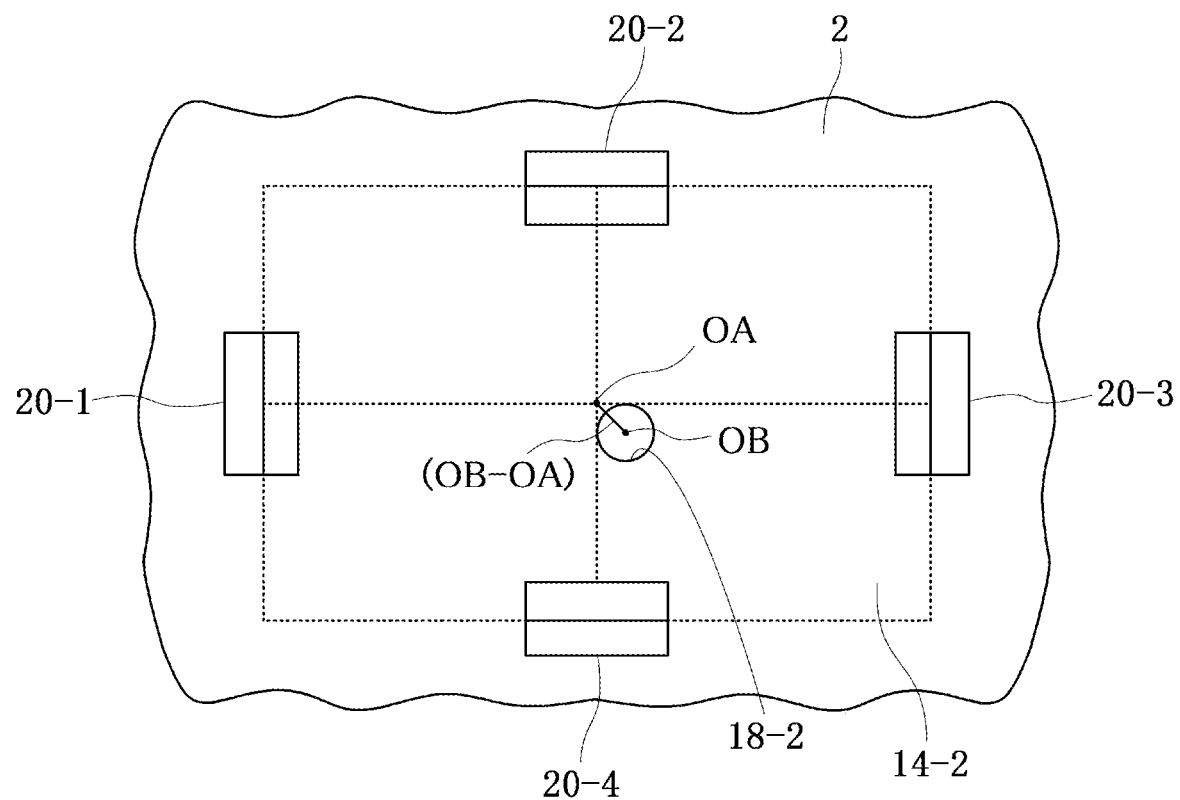
FIG. 2 is for describing an inspection method of a printed wiring board according to an embodiment of the present invention.

FIG. 2 is for describing a method of inspecting a printed wiring board according to an embodiment of the present invention. In the embodiment illustrated in FIG. 2, the one circular via (18-2) is formed at a center of the quadrangular inner-layer land (14-2) in the test coupon region 2. Then, a center coordinate of the inner-layer land (14-2) is OA, and a center coordinate of the via (18-2) with respect to the inner-layer land (14-2) is OB.

In the example illustrated in FIG. 2, in the inspection method of a printed wiring board according to an embodiment of the present invention, first, in the test coupon region 2, at the same time as processing the via (18-2), four outer peripheral parts ((20-1)-(20-4)) of the inner-layer land (14-2) are processed, and, together with the via (18-2), the outer peripheral parts ((20-1)-(20-4)) (here, one on each side) of the inner-layer land (14-2) are exposed. Next, based on positions of the exposed outer peripheral parts ((20-1)-(20-4)) of the inner-layer land (14-2), the center coordinate (OA) of the inner-layer land (14-2) is determined. Next, based on a shape of the processed via (18-2), the center coordinate (OB) of the via (18-2) with respect to the inner-layer land (14-2) is determined. Next, from the center coordinate (OA) of the inner-layer land (14-2) and the center coordinate (OB) of the via (18-2) with respect to the inner-layer land (14-2) that have been determined, a misalignment amount (OB-OA) between the via (18-2) and the inner-layer land (14-2) is determined. Then, based on the determined misalignment amount (OB-OA), alignment accuracy between the via (18-2) and the inner-layer land (14-2) is inspected. A design value of the center coordinate (OB) of the via (18-2) is the same as that of the center coordinate (OA) of the inner-layer land (14-2).

In the example illustrated in FIG. 2, the inner-layer land (14-2) of the test coupon region 2 is formed at the same time as the inner-layer land (14-1) of the product region 1, and the via (18-2) of the test coupon region 2 is formed at the same time as the via (18-1) of the product region 1. Therefore, a misalignment amount between the inner-layer land (14-1) and the via (18-1) in the product region 1 is the same as the misalignment amount (OB-OA) between the inner-layer land (14-2) and the via (18-2) of the test coupon region 2. As a result, for example, an inspection can be performed such as that, when the misalignment amount (OB-OA) in the printed wiring board 10 is within a predetermined range, it is determined as a normal product. Then, the inspection result can be applied to change a condition or the like for the next manufacturing process.

Figure 3:
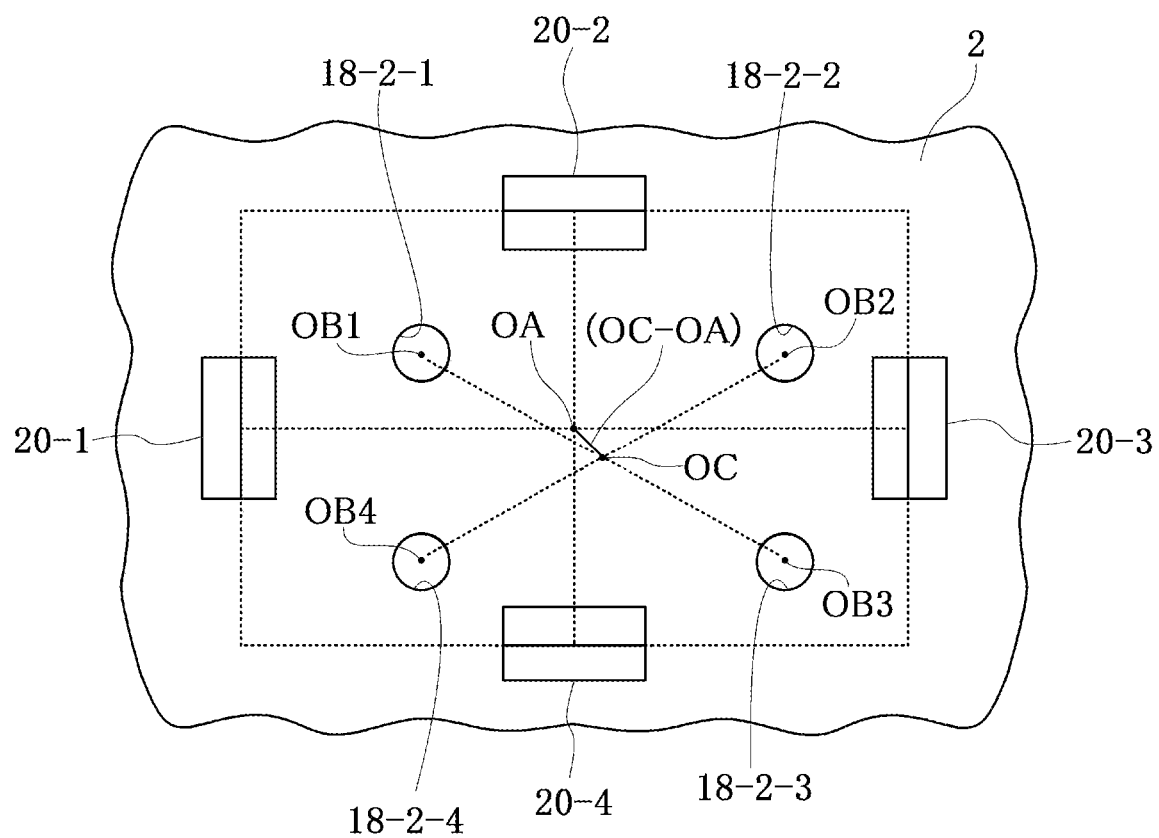
FIG. 3 is for describing an inspection method of a printed wiring board according to another embodiment of the present invention.

FIG. 3 is for describing a method of inspecting a printed wiring board according to another embodiment of the present invention. In the embodiment illustrated in FIG. 3, four circular vias ((18-2-1)-(18-2-4)) are formed at four corners of the quadrangular inner-layer land (14-2) in the test coupon region 2. Then, an intersection point between a line segment connecting a center (OB1) of the via (18-2-1) and a center (OB3) of the via (18-2-3), which are at opposing corners, and a line segment connecting a center (OB2) of the via (18-2-2) and a center (OB4) of the via (18-2-4), which are at opposing corners, is a center coordinate (OC) of the vias (18-2) with respect to the inner-layer land (14-2).

In the example illustrated in FIG. 3, in the inspection method of a printed wiring board according to an embodiment of the present invention, first, in the test coupon region 2, at the same time as processing the vias ((18-2-1)-(18-2-4)) at the four locations, four outer peripheral parts ((20-1)-(20-4)) of the inner-layer land (14-2) are processed, and, together with the vias ((18-2-1)-(18-2-4)), the outer peripheral parts ((20-1)-(20-4)) (here, one on each side) of the inner-layer land (14-2) are exposed. Next, based on positions of the exposed outer peripheral parts ((20-1)-(20-4)) of the inner-layer land (14-2), the center coordinate (OA) of the inner-layer land (14-2) is determined. Next, based on shapes of the processed vias ((18-2-1)-(18-2-4)), from the intersection point between the line segment connecting the center (OB1) of the via (18-2-1) and the center (OB3) of the via (18-2-3), which are at opposing corners, and the line segment connecting the center (OB2) of the via (18-2-2) and the center (OB4) of the via (18-2-4), which are at opposing corners, the center coordinate (OC) of the vias (18-2) with respect to the inner-layer land (14-2) is determined. Next, from the center coordinate (OA) of the inner-layer land (14-2) and the center coordinate (OC) of the vias (18-2) with respect to the inner-layer land (14-2) that have been determined, a misalignment amount (OC-OA) between the vias (18-2) and the inner-layer land (14-2) is determined. Then, based on the determined misalignment amount (OC-OA), alignment accuracy between the vias (18-2) and the inner-layer land (14-2) is inspected. A design value of the center coordinate (OC) determined from the vias ((18-2-1)-(18-2-4)) is the same as that of the center coordinate (OA) of the inner-layer land (14-2).

In the example illustrated in FIG. 3, the inner-layer land (14-2) of the test coupon region 2 is formed at the same time as the inner-layer land (14-1) of the product region 1, and the vias ((18-2-1)-(18-2-4)) of the test coupon region 2 are formed at the same time as the via (18-1) of the product region 1. Therefore, the misalignment amount between the inner-layer land (14-1) and the via (18-1) in the product region 1 is the same as the misalignment amount (OC-OA) between the inner-layer land (14-2) and the vias (18-2) of the test coupon region 2. As a result, for example, an inspection can be performed such as that, when the misalignment amount (OC-OA) in the printed wiring board 10 is within a predetermined range, it is determined as a normal product. Then, the inspection result can be applied to change a condition or the like for the next manufacturing process.

When a via in the test coupon region 2 has a deformed shape, when the misalignment amount (OB-OA) determined using the one via (18-2) illustrated in FIG. 2 and the misalignment amount (OC-OA) determined using the four vias ((18-2-1)-(18-2-4)) illustrated in FIG. 3 are compared, the misalignment amount (OC-OA) is smaller than the misalignment amount (OB-OA), and it is preferable to use the misalignment amount (OC-OA) determined using the four vias ((18-2-1)-(18-2-4)) for the inspection.

In the examples illustrated in FIGS. 2 and 3, the inner-layer land (14-2) has a quadrangular shape. However, the inner-layer land (14-2) is not limited to having this shape, and may have other shapes such as a circular shape. Further, the inner-layer land (14-2) has four exposed parts, one on each side. However, the number of the exposed parts is not limited to this as long as the shape of the inner-layer land (14-2) can be determined from portions of the inner-layer land (14-2) that can be observed from the exposed parts. Further, with respect to the one inner-layer land (14-2), there is one via in the example of FIG. 2, and there are three vias in the example of FIG. 3. However, the number of the vias is not limited to these numbers as long as the center coordinate of the vias with respect to the inner-layer land can be determined.

An example of design of the test coupon region 2 is as follows. First, each via (18-2) has a diameter that is the same as that of the via (18-1) of the product region 1, and at least one via (18-2) is provided for the inner-layer land (14-2). Further, the inner-layer land (14-2) preferably has a size of (300 μm)×(300 μm), and can have any shape. Further, openings of the outer peripheral parts ((20-1)-(20-4)) can be formed, for example, by irradiating laser with a via diameter of 60 μm at a pitch of 30 μm to 9 places of 3×3 in an overlapping manner.

In the example illustrated in FIG. 2 and in the example illustrated in FIG. 3, in order to determine the center coordinate (OA) of the inner-layer land (14-2) based on the shapes of the exposed outer peripheral parts ((20-1)-(20-4)) of the inner-layer land (14-2), an image measuring device is measured. As an example of the image measuring device, a high-precision CNC image measuring device Hyper Quick Vision: Hyper QV606 manufactured by Mitutoyo can be used.

In an inspection method of a printed wiring board according to an embodiment of the present invention having the above-described structure, by quantifying the misalignment amount between the vias and the inner-layer land in the printed wiring board, the alignment accuracy between the vias and the inner-layer land can be accurately inspected.

In the inspection method described in Japanese Patent Application Laid-Open Publication No. 2008-181998, in a printed wiring board having a large thickness, the capability of recognizing a misalignment amount of a via based on a transmission image captured with X-ray is reduced. Therefore, alignment accuracy between a via and an inner-layer land cannot be inspected.

An inspection method of a printed wiring board according to an embodiment of the present invention includes: preparing a printed wiring board that has a product region and a test coupon region; processing a via on an inner-layer land in each of the product region and the test coupon region; exposing outer peripheral parts of the inner-layer land of the test coupon region by processing the outer peripheral parts at the same time as processing the via; determining a center coordinate (center coordinate (OA)) of the inner-layer land of the test coupon region based on positions of the exposed outer peripheral parts; determining a center coordinate (center coordinate (OB)) of the via processed in the test coupon region based on a shape of the via; determining a distance (misalignment amount) between the center coordinate (OA) and the center coordinate (OB); and confirming alignment accuracy between the via and the inner-layer land based on the misalignment amount.

Obviously, numerous modifications and variations of the present invention are possible in light of the above teachings. It is therefore to be understood that within the scope of the appended claims, the invention may be practiced otherwise than as specifically described herein.

What is claimed is:

1. A method of inspecting a printed wiring board, comprising:
    preparing a printed wiring board having a product region and a test coupon region such that the printed wiring board has an inner-layer land in the product region and an inner-layer land in the test coupon region;
    forming at least one via on the inner-layer land in the product region and at least one via on the inner-layer land in the test coupon region;
    forming at least one outer peripheral part in the printed wiring board such that the at least one outer peripheral part exposes at least one outer peripheral portion of the inner-layer land in the test coupon region;
    determining a center coordinate of the inner-layer land in the test coupon region based on a position of the at least one outer peripheral part;
    determining a center coordinate of the at least one via formed on the inner-layer land in the test coupon region based on a shape of the at least one via formed on the inner-layer land in the test coupon region;
    determining a misalignment amount based on a distance between the center coordinate of the inner-layer land in the test coupon region and the center coordinate of the at least one via formed on the inner-layer land in the test coupon region; and
    determining alignment accuracy between the via and the inner-layer land of the test coupon region based on the misalignment amount.

2. The method of inspecting a printed wiring board according to claim 1, wherein the forming of the at least one outer peripheral part comprises forming a plurality of outer peripheral parts such that the plurality of outer peripheral parts exposes a plurality of outer peripheral portions of the inner-layer land in the test coupon region, and the determining of the center coordinate of the inner-layer land in the test coupon region comprises determining the center coordinate of the inner-layer land in the test coupon region based on a plurality of positions of the plurality of outer peripheral parts.

3. The method of inspecting a printed wiring board according to claim 2, wherein the forming of the at least one via on the inner-layer land in the product region and the at least one via on the inner-layer land in the test coupon region comprises forming a plurality of vias on the inner-layer land in the test coupon region, and the determining of the center coordinate of the at least one via formed on the inner-layer land in the test coupon region comprises determining the center coordinate of the plurality of vias with respect to the inner-layer land in the test coupon region based on shapes of the plurality of vias.

4. The method of inspecting a printed wiring board according to claim 3, wherein the forming of the at least one via on the inner-layer land in the product region and the at least one via on the inner-layer land in the test coupon region, and the forming of the at least one outer peripheral part are conducted in a same process.

5. The method of inspecting a printed wiring board according to claim 4, wherein the determining of the alignment accuracy comprises setting a range of misalignment amount and determining the alignment accuracy based on the range of misalignment amount.

6. The method of inspecting a printed wiring board according to claim 3, wherein the determining of the alignment accuracy comprises setting a range of misalignment amount and determining the alignment accuracy based on the range of misalignment amount.

7. The method of inspecting a printed wiring board according to claim 3, wherein the determining of the center coordinate of the inner-layer land in the test coupon region comprises measuring the position of the at least one outer peripheral part by an image measuring device.

8. The method of inspecting a printed wiring board according to claim 2, wherein the forming of the at least one via on the inner-layer land in the product region and the at least one via on the inner-layer land in the test coupon region, and the forming of the at least one outer peripheral part are conducted in a same process.

9. The method of inspecting a printed wiring board according to claim 2, wherein the determining of the alignment accuracy comprises setting a range of misalignment amount and determining the alignment accuracy based on the range of misalignment amount.

10. The method of inspecting a printed wiring board according to claim 2, wherein the determining of the center coordinate of the inner-layer land in the test coupon region comprises measuring the position of the at least one outer peripheral part by an image measuring device.

11. The method of inspecting a printed wiring board according to claim 1, wherein the forming of the at least one via on the inner-layer land in the product region and the at least one via on the inner-layer land in the test coupon region comprises forming a plurality of vias on the inner-layer land in the test coupon region, and the determining of the center coordinate of the at least one via formed on the inner-layer land in the test coupon region comprises determining the center coordinate of the plurality of vias with respect to the inner-layer land in the test coupon region based on shapes of the plurality of vias.

12. The method of inspecting a printed wiring board according to claim 11, wherein the forming of the at least one via on the inner-layer land in the product region and the at least one via on the inner-layer land in the test coupon region, and the forming of the at least one outer peripheral part are conducted in a same process.

13. The method of inspecting a printed wiring board according to claim 11, wherein the determining of the alignment accuracy comprises setting a range of misalignment amount and determining the alignment accuracy based on the range of misalignment amount.

14. The method of inspecting a printed wiring board according to claim 11, wherein the determining of the center coordinate of the inner-layer land in the test coupon region comprises measuring the position of the at least one outer peripheral part by an image measuring device.

15. The method of inspecting a printed wiring board according to claim 1, wherein the forming of the at least one via on the inner-layer land in the product region and the at least one via on the inner-layer land in the test coupon region, and the forming of the at least one outer peripheral part are conducted in a same process.

16. The method of inspecting a printed wiring board according to claim 15, wherein the determining of the alignment accuracy comprises setting a range of misalignment amount and determining the alignment accuracy based on the range of misalignment amount.

17. The method of inspecting a printed wiring board according to claim 15, wherein the determining of the center coordinate of the inner-layer land in the test coupon region comprises measuring the position of the at least one outer peripheral part by an image measuring device.

18. The method of inspecting a printed wiring board according to claim 1, wherein the determining of the alignment accuracy comprises setting a range of misalignment amount and determining the alignment accuracy based on the range of misalignment amount.

19. The method of inspecting a printed wiring board according to claim 18, wherein the determining of the center coordinate of the inner-layer land in the test coupon region comprises measuring the position of the at least one outer peripheral part by an image measuring device.

20. The method of inspecting a printed wiring board according to claim 1, wherein the determining of the center coordinate of the inner-layer land in the test coupon region comprises measuring the position of the at least one outer peripheral part by an image measuring device.

* * * * *